US006457986B2

United States Patent
Hirata

(10) Patent No.: US 6,457,986 B2
(45) Date of Patent: Oct. 1, 2002

(54) CAM RETAINING MEANS FOR ZIF ELECTRICAL CONNECTOR

(75) Inventor: Toshihisa Hirata, Yamato (JP)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 09/799,203

(22) Filed: Mar. 5, 2001

(30) Foreign Application Priority Data

Mar. 14, 2000 (JP) ........................................ 2000-069768

(51) Int. Cl.⁷ .......................................... H01R 13/625
(52) U.S. Cl. ...................................................... 439/342
(58) Field of Search ................... 439/342, 259, 439/266

(56) References Cited

U.S. PATENT DOCUMENTS

| | | | | |
|---|---|---|---|---|
| 4,420,205 A | * | 12/1983 | Kirkman | ..................... 439/342 |
| 6,116,936 A | | 9/2000 | Pei | .............................. 439/342 |
| 6,280,224 B1 | * | 8/2001 | Huang | ........................ 439/342 |

* cited by examiner

*Primary Examiner*—Tho D. Ta
(74) *Attorney, Agent, or Firm*—Robert J. Zeitler

(57) ABSTRACT

A electrical connector for a pin grid array package includes a base housing for mounting a plurality of terminals in grid array fashion, and a slide plate formed with through holes in grid array fashion corresponding to each of the terminals and overlaid on the upper side of the base housing. The slide plate slides between a position in which a pin of the pin grid array package is held adjacent to one of the terminals position and a position in which the pin is engaged with the terminal. A cam member is inserted through a cam opening formed in the slide plate and rotatably supported on the base housing so that a cam surface and an opening edge are mutually opposed. Engaging means rotatably secure the cam member in proper axial position with respect to the base housing. A flat surface formed on the cam surface abuts a straight edge formed on the cam opening when the slide plate is in the position in which the pin is engaged with the terminals.

8 Claims, 5 Drawing Sheets

CAM RETAINING MEANS FOR ZIF ELECTRICAL CONNECTOR

FIELD OF THE INVENTION

The present invention relates generally to an electrical connector or socket for a pin grid array package.

DESCRIPTION OF THE RELATED ART

Typically, an electrical connector for a pin grid array ("PGA") package comprises a base housing for mounting a plurality of terminals in grid array fashion, and a slide plate formed with through holes in grid array fashion corresponding to the respective terminals and overlaid on the interior side of the base housing. The slide plate is adapted for sliding between a first insertion position and a second engagement position. In the first insertion position, the pins of the PGA package can be inserted adjacent to, but without engaging, the respective terminals with relatively small or zero insertion force. In the second engagement position, the pins are engaged with the respective terminals.

Sliding means or actuators for the slide plate are well known. One type of previously published sliding means includes a cam shaft mounted along the rear edge of the base housing to pivot the cam shaft by an operating handle provided along the side portion of the electrical connector. See Japanese Unexamined Patent Publication (Kokai) No. Heisei 7-142134. Another published sliding means includes a cam member inserted through the base housing and the slideplate and rotated by means of a flat bladed tool such as a screw driver. See U.S. Pat. No. 6,116,936.

However, the type of sliding means in which the cam member is inserted through the base housing and the slide plate is susceptible to a problem known as "kickback." More specifically, when the slide plate is in the second engagement position, a force due to the resilience of the terminals tends to urge the slide plate away from the base housing and, thereby, to extract the cam member from its proper position with respect to the base housing. Also, the kickback force tends to move the slide plate back towards the first insertion position, thereby make the engagement between the pins and the respective terminals relatively less stable. Accordingly, despite the impressive achievements of earlier inventors, there still exists a need for an improved electrical connector.

SUMMARY OF THE INVENTION

The present invention includes a cam member having engaging means which rotatably engage the base housing. Said engaging means resist the tendency of kickback force to extract the cam member from its proper operating position. Additionally, the present invention may include a cam member having a cam surface which includes a flat wall. When the slide plate is in a pre-determined position, the flat wall abuts a cam opening having an inside surface which includes a straight edge. The flat wall in acts on cooperation with the straight edge to resist the tendency of kickback force to move the slide plate way from the first insertion position or the second engagement position In a preferred aspect, the invention is an electrical connector for a pin grid array package which includes a generally planar base housing. The base housing has an exterior side which faces outwardly from the electrical connector and an interior side which faces in the opposite direction from the exterior side. The interior side includes a generally cylindrically shaped protuberance which extends in a direction generally transversely from the interior side. The base housing also defines a passage which extends axially through the protuberance from the interior side to a point adjacent the exterior side. Terminals are mounted on the base housing in an array which generally corresponds to the array of the pin grid package.

The electrical connector also includes a generally planar slide plate which defines a cam opening having an inside surface and through holes corresponding to the terminals. The side plate is disposed adjacent the interior side of the base housing, and is slidably movable between a first insertion position and a second engagement position. In the first insertion position, a lead pin of the pin grid array package can be inserted into a mounting portion adjacent at least one of the terminals. In the second engagement position, the lead pin is engaged with at least one of the terminals The electrical connector additionally includes an eccentric cam member including a cam portion which defines a cam surface, a barrel which defines a bearing bore, an engaging leg which extends within and generally along the axis of the bearing bore, and engaging means for engaging the bearing bore or the exterior side. Said engaging means is mounted on the engaging leg. The cam member projects into the cam opening so that the cam surface is adjacent the inside surface. The protuberance projects into the bearing bore to rotatably support the cam member. The engaging leg projects into the passage. Said engaging means engages the barrel or the exterior side to resist axial movement of the cam member relative to the bearing bore.

Preferably, the engaging leg is strained within the barrel so as to urge said engaging means into engagement with the barrel or the exterior side of the slide plate. Preferably, said engaging means includes a hook mounted on the engagement leg and a step defined by the barrel adjacent the bearing bore.

DESCRIPTION OF A PREFERRED EMBODIMENT

Figure 1:
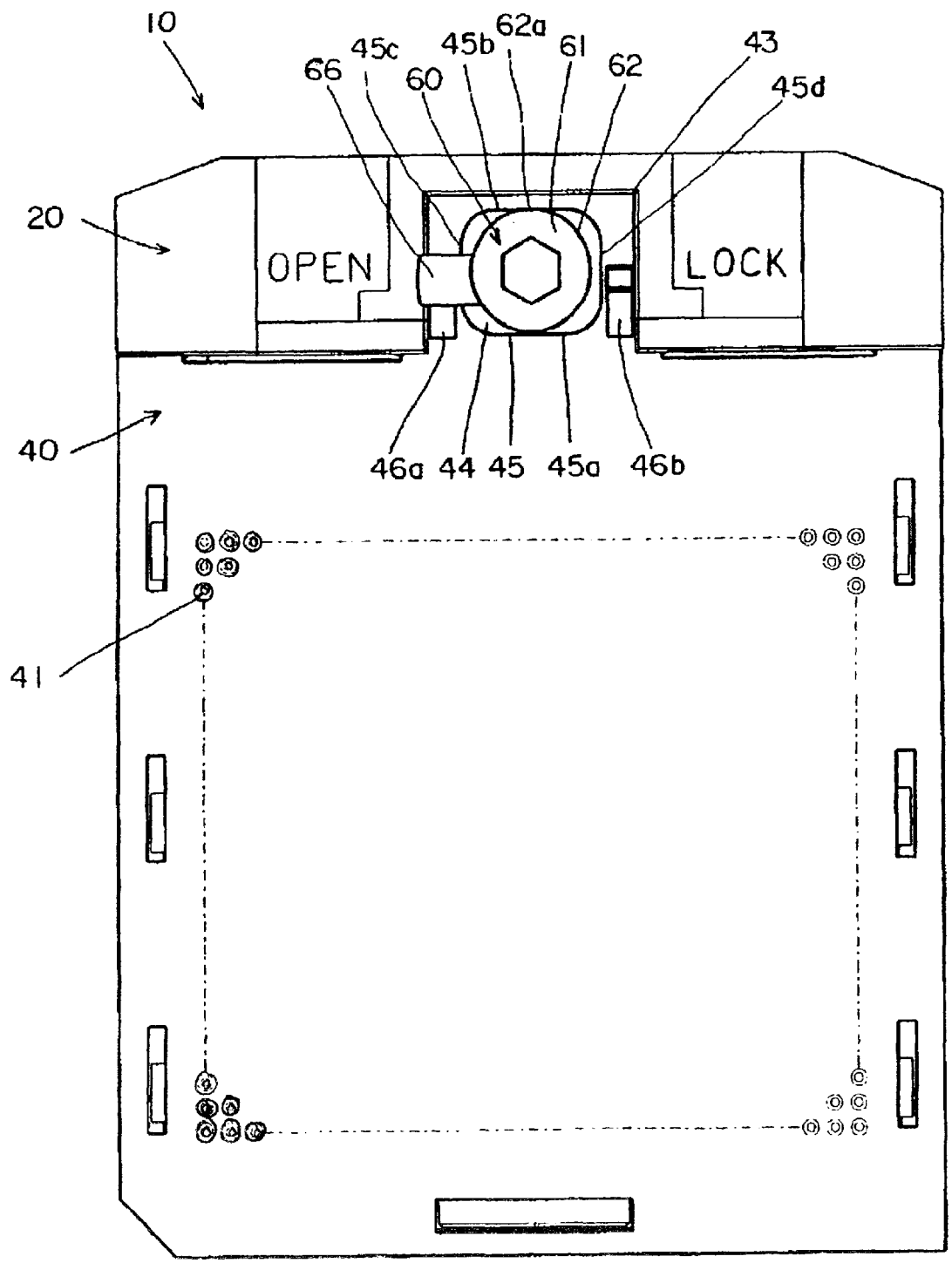
FIG. 1 is a top plan view of a embodiment of a electrical connector for PGA package according to the present invention.
Figure 2:
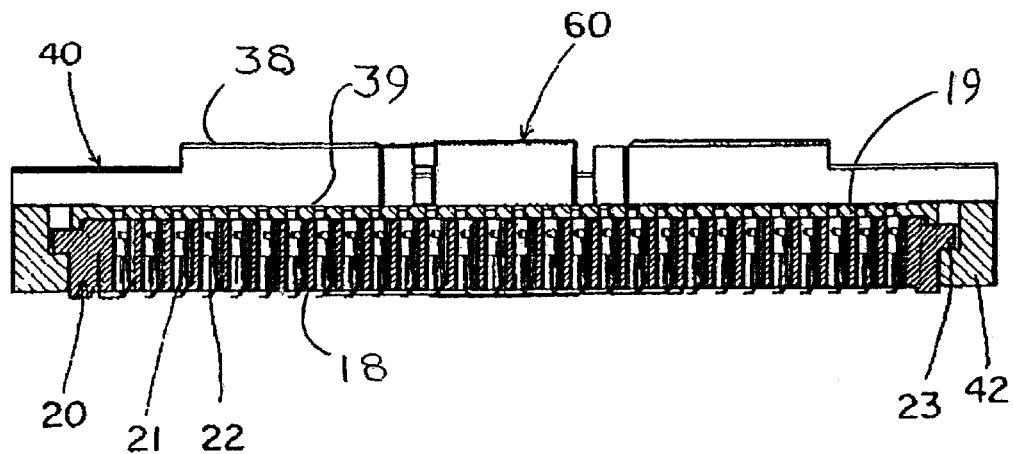
FIG. 2 is a longitudinal section of the electrical connector depicted in FIG. 1.

In a preferred embodiment, the invention is an electrical connector 10 for a pin grid array package as shown in FIG. 1. The electrical connector 10 comprises a generally planar and quadrangular shaped base housing 20 and a generally planar and quadrangular shaped slide plate 40 overlaid on the interior side of base housing 20. A plurality of terminals 21 shown in FIG. 2 are mounted in grid array 26 fashion on base housing 20. Tails 22 extend from each the terminals 21 and are arranged on the bottom surface of base housing 20. A mounting portion of each of the terminals 21 is open for receiving a pin of a PGA package (not shown).

Slide plate 40 is formed with through holes 41 in grid array 30 fashion generally corresponding to the terminals 21. Each of two guide projections 23 formed on opposite edges of the base housing 20 mates with one of generally L-shaped edge plates 42. The edge plates 42 extend downwardly from the edges of the slide plate 40, so that the slide plate 40 is adapted for sliding back and forth along interior side 19 of base housing 20.

Figure 3:
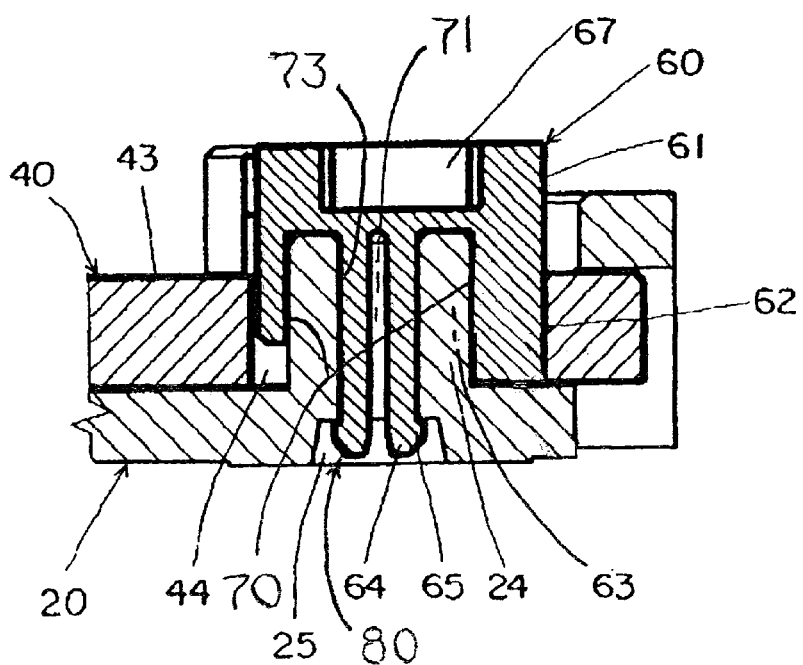
FIG. 3 is an enlarged section of a cam member of a electrical connector for PGA package according to the present invention.
Figure 4:
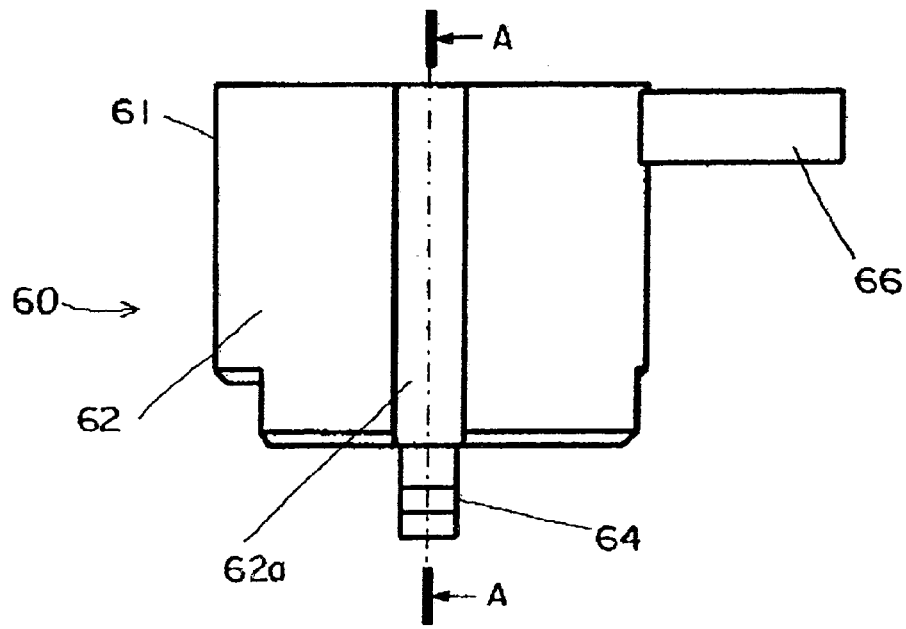
FIG. 4 is a plan view of a cam member for the present invention.
Figure 5:
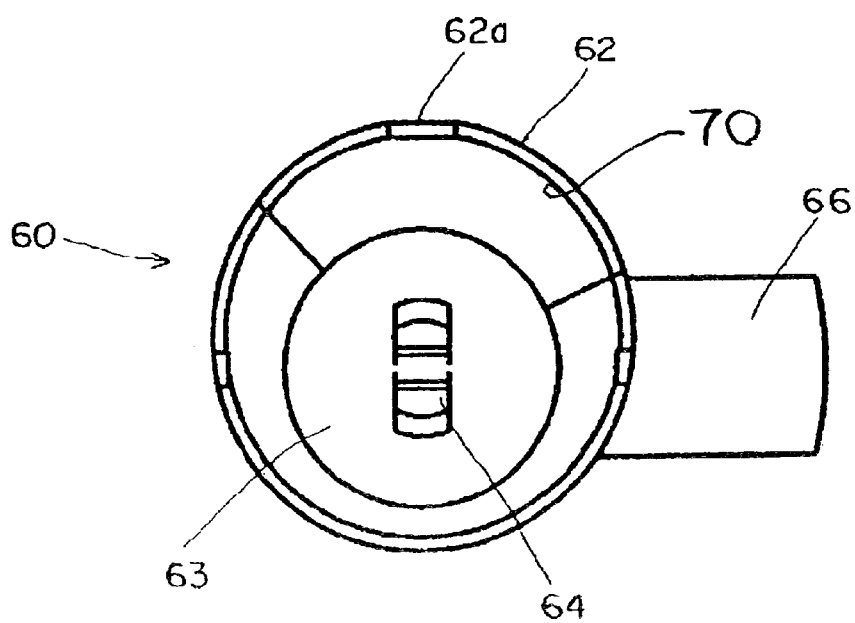
FIG. 5 is a bottom view of a cam member for the present invention.
Figure 6:
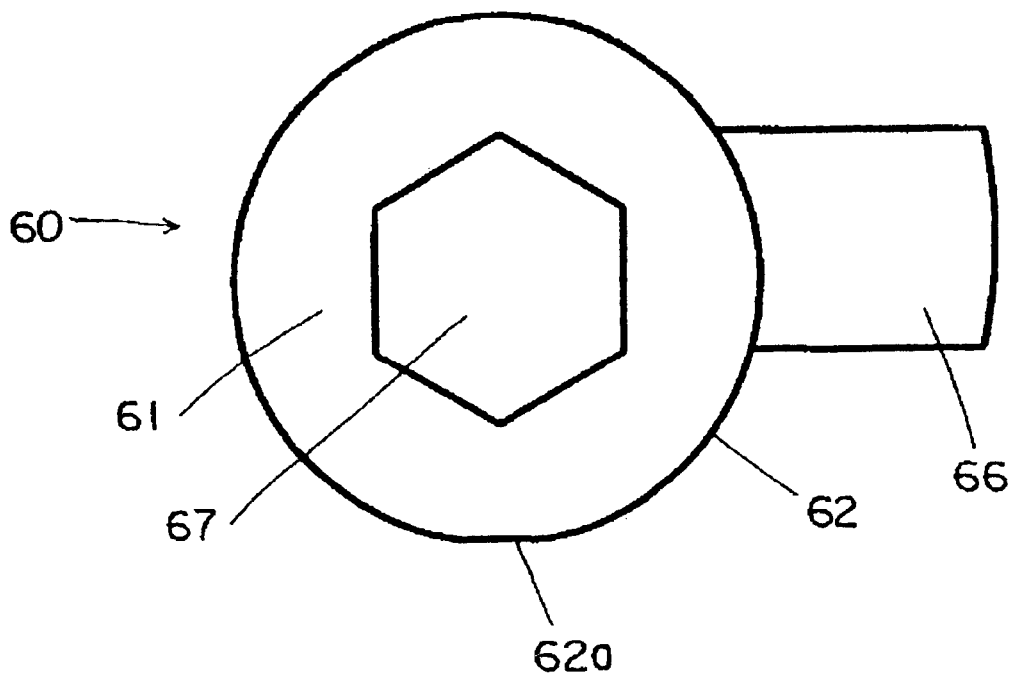
FIG. 6 is a top plan view of a cam member for the present invention.
Figure 7:
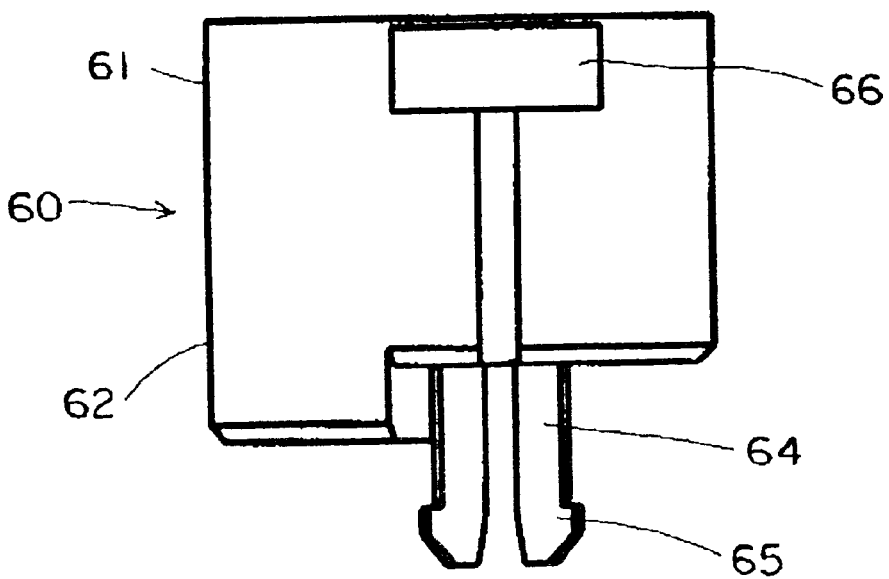
FIG. 7 is a side elevation view of a cam member for the present invention.
Figure 8:
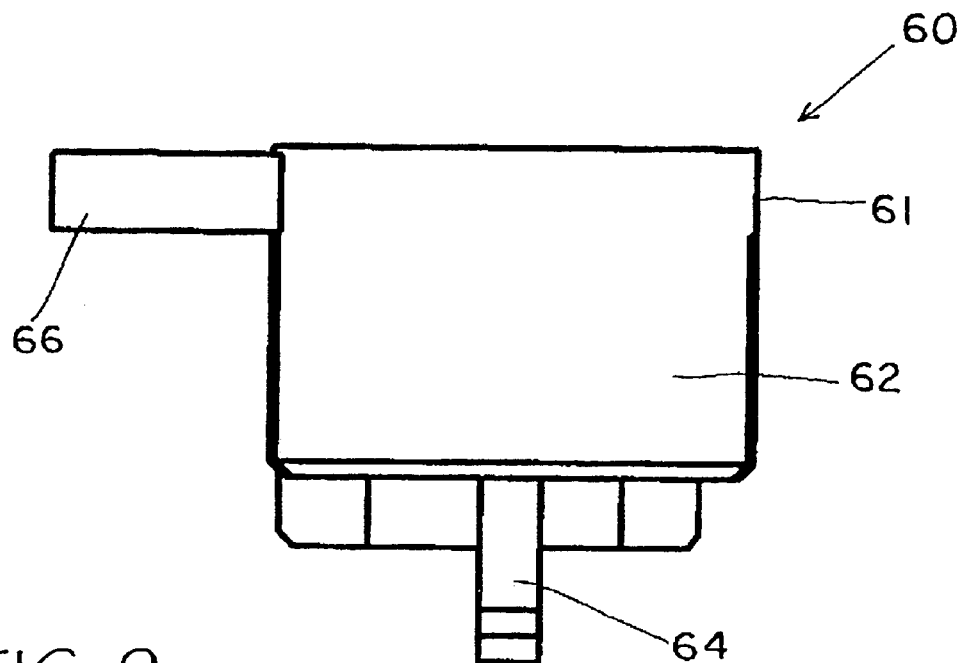
FIG. 8 is a rear elevation view of a cam member for the present invention.
Figure 9:
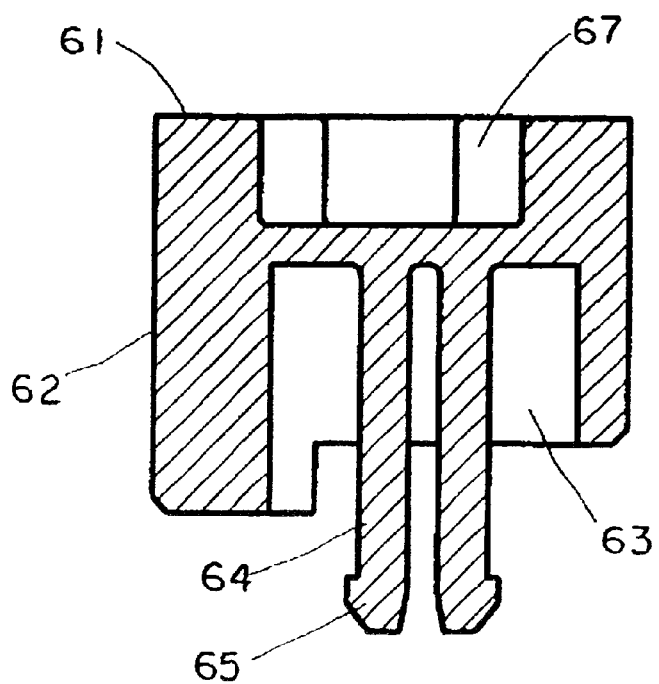
FIG. 9 is a section taken generally along line A—A of FIG. 4.

As shown in FIG. 1 and FIG. 3, a cam member 60 including an indicator 66 is rotatably mounted at one end of base housing 20. A cam opening 44 is formed in an ear piece 43 projecting from one end of slide plate 40. A cam portion 61 of the cam member 60 projects upwardly into the cam opening 44. A cam surface 62 and an inside surface 45 are immediately adjacent and mutually opposed to each other The cam member 60 is a substantially hollow, generally cylindrical member constructed in one piece as shown in FIGS. 4 through 9. For clarity, the end of cam member 60 attached to indicator 66 is referred to as "the indicator end", and the opposite end of cam member 60 is referred to as "the engagement end". The outer, circumferential portion of the indicator end forms a cam portion 61. A bearing bore 63 extends from the engagement end substantially into the interior of cam member 60. The bearing bore 63 is defined by an inner, circumferential surface designated as barrel 70. Bearing bore 63 is eccentric relative to cam portion 61.

A protuberance 24 is provided on the interior side 19 of the base housing 20. Protuberance 24 projects into bearing bore 63 and rotatably supports cam member 60. Preferably, protuberance 24 extends through the cam opening 44 and beyond the exterior surface 38 of the slide plate 40. The bearing bore 63 is preferably adapted to be fitted over substantially the entire length of the protuberance 24.

Additionally, cam member 60 is provided with engaging means to engage the barrel 71 or the exterior side 18 of base housing 20 in order to resist axial movement of cam member 60 relative to base housing [18]. For example, engaging means 80 may include one or more engaging legs 64 which extend along the axis of bearing bore 63 toward the engagement end of cam member 60. Preferably, engaging legs 64 extend past an end of bearing bore 63 and terminate in an outwardly directed hook 65. Engaging legs 64 are inserted into a passage 71 which extends axially through protuberance 24. The passage 71 is defined by an interior surface 73 of the base housing 20. Preferably, at least a portion of each of the hooks 65 extends beyond an end of passage 71 into a recess portion 25 formed in an exterior side 18 of base housing 20.

It is also preferred that engaging legs 64 or hooks 65 are resilient and, when inserted into the passage 71, are slightly strained or deformed so that this resiliency urges the hooks 65 into engagement with the internal surface 73, recess portion 25, or exterior side 18. In each case, hooks 65 are engaged with base housing 20 to resist any force which might tend to move cam member 60 axially away from base housing 20.

As shown in FIGS. 4 to 9, cam member 60 is formed with a flat wall 62a in cam surface 62. Flat wall 62a is formed at the location in cam surface 62 which corresponds to the first insertion position or the second engagement position of slide plate 40. FIG. 1 shows slide plate 40 in the "OPEN" or first insertion position It should be apparent that rotating cam member 60 will place indicator 66 in the "LOCK" or second engagement position.

As shown in FIG. 1, flat wall 62a abuts straight edge 45b with slide plate 40 in the first insertion position. As can be readily determined from the positions of indicator 66 and guide projections 23, FIG. 1 shows slide plate 40 in the "OPEN" or first insertion position with slide plate 40 relatively less axially offset from base housing 20 when slide plate 40 will be when it is in the "LOCK" or second engagement position. However, it is contemplated that the invention may also be utilized in an electrical connector in which a slide plate is relatively more axially offset in the first insertion position with respect to a base housing, as compared to its axial offset in the second engagement position.

In order to provide greater stability for the second engagement position, flat wall 62 may be is formed over the entire length in the longitudinal direction of cam portion 61. Furthermore, indicator 66 projects radially from the upper portion of cam portion 61 at an angle of about 90° with flat wall 62a as viewed from the center of bearing bore 63. A hexagonal recess portion 67 is formed on the upper surface of cam portion 61 so that cam member 60 can be pivotably operated directly by a rotating tool consisting of a hexagonal bar. Of course, the recess portion 67 may be formed to accept other well known tools.

Cam opening 44 formed in ear piece 43 of slide plate 40 is generally quadrangular as shown in FIG. 1. Inside surface 45 of cam opening 44 comprises two pairs of straight edges including straight edges 45a, 45b mutually opposing in the axial direction of travel for slide plate 40, and straight edges 45c, 45d mutually opposing in a lateral direction as compared to the direction of travel for slide plate 40. Straight edges 45a, 45b are spaced apart at a distance which is about equal to the diameter of cam portion 61. Straight edges 45c, 45d are spaced apart at a distance which is significantly greater than the diameter of cam portion 61 in order to permit free movement in view of the eccentricity of cam member 60.

Adjacent cam opening 44, stoppers 46a, 46b are adapted to alternately engage indicator 66. Stopper 46a is located near the intersection of straight edge 45a with straight edge 45c. Stopper 46b is located near the intersection of straight edge 45a with straight edge 45c. Indicator 66 extends generally along the upper surface of ear piece 43 at a distance from the slide plate exterior side 38 which results in engagement with the stoppers 46a, 46b.

FIG. 1 depicts the relation of slide plate 40 to base housing 20 when both are in the first insertion position. At that time, indicator 66 is pointed toward the legend "OPEN" which is provided on the surface of base housing 20, and is engaged with stopper 46a. Flat wall 62a is approximately parallel to and engaged with straight edge 45b.

When cam member 60 is rotated to the position depicted in FIG. 1, the engagement between flat wall 62a of cam surface 62 and straight edge 45b of inside surface edge 45 transmits a clicking feeling to a human operator. After the engagement, cam member 60 is at least partially protected from unintended rotation by vibration, accident or the like. This engagement also provides some protection against over-rotation of can member 60 in the counter clockwise direction.

With the slide plate 40 in the first insertion position, the PGA package to be connected may be mounted on slide plate 40 with the lead pins of the PGA package extending toward the base housing 20. In this manner, the lead pins can be inserted into the mounting portion of terminals 21 with zero insertion force or insertion force close to zero.

After the PGA package is mounted, cam member 60 is pivoted at 180° in the clockwise direction to complete the connection. Under the influence of rotating cam member 60, slide plate 40 slides along base housing 20 in the direction of greater axial offset relative to base housing 40, the lead pins inserted moved to the second position of engagement.

The clockwise rotation of cam member 60 is interrupted when indicator 66 engages with stopper 46b. At that time, flat wall 62a of cam surface 62 is generally parallel to and engaged with straight edge 45a. The engagement transmits another clicking feeling as a signal to a human operator.

When the lead pins are moved to the second position of engagement with terminals 21, the resilience of terminals 21 exerts a kickback force on slide plate 40 via the lead pins. In fact, this kickback force may cause the cam members of conventional electrical connectors to rotate and their slide plates to move from the second engagement position. However, with the present invention, flat wall 62a is generally parallel straight edge 45a, so that it the electrical connector 10 of the present invention is relatively immune to the adverse effects of kickback force.

Although the present invention has been illustrated and described with respect to a preferred embodiment, it will be understood by those skilled in the art that the foregoing and various other changes, omissions and additions may be made to the preferred embodiment without departing from the spirit and scope of the present invention. The present invention is not be understood as limited to the preferred embodiment set out above but, rather, includes all possible embodiments which can be embodied within a scope encompassed and equivalents thereof with respect to the features set out in the appended claims.

What is claimed is:

1. An electrical connector for a pin grid array package comprising:
    a base housing which includes
        an exterior side facing outwardly from the electrical connector and
        an interior side forming a generally cylindrically shaped protuberance which extends generally transversely from the interior side, and
        an internal surface defining a passage which extends axially through the protuberance from the interior side to adjacent the exterior side;
    a plurality of terminals mounted on the base housing in an array which generally corresponds to the array of the pin grid package;
    a slide plate which
        defines a cam opening having an inside surface and through holes corresponding to the terminals,
        is disposed adjacent the interior side, and
        is slidably movable between
            a first insertion position in which a lead pin of said pin grid array package can be inserted via one of the through holes into a location adjacent to, but without engaging, at least one of the terminals and a second engagement position in which the lead pin is engaged with at least one of the terminals; and
    an eccentric cam member which includes
        a cam portion which defines a cam surface,
        a barrel which defines a bearing bore,
        an engaging leg which extends within and generally along the axis of the bearing bore and projects into the passage from the interior side, and
        engaging means for engaging the internal surface or the exterior side, said engaging means being mounted on the engaging leg;
    wherein
        the cam member projects into the cam opening so that the cam surface is adjacent the inside surface,
        the protuberance projects into the bearing bore to rotatably support the cam member,
        the engaging leg projects into the passage, and
        said engaging means engages the internal surface or the exterior side to resist axial movement of the cam member relative to the bearing bore.

2. The electrical connector of claim 1 in which the engaging leg is strained within the passage so as to urge said engaging means into engagement with the internal surface or the exterior side.

3. The electrical connector of claim 1 in which said engaging means includes a hook mounted on the engagement leg.

4. The electrical connector of claim 1 in which said engaging means includes a hook mounted on the engagement leg, the hook being suitable to engage the exterior side.

5. The electrical connector of claim 1 in which the cam member forms a flat wall in the cam surface, the inside surface of the cam opening comprises a straight edge extending perpendicularly to the direction in which the slide is slidably movable and, when the slide plate is in the second engagement position, the flat wall abuts the straight edge to resist movement of the slide plate from the second engagement position.

6. The electrical connector of claim 1 in which the cam member forms a flat wall in the cam surface, the inside surface of the cam opening comprises a straight edge extending perpendicularly to the direction in which the slide is slidably movable and, when the slide plate is in the first insertion position, the flat wall abuts the straight edge to resist movement of the slide plate from the first insertion position.

7. The electrical connector of claim 1 in which the slide plate includes a stopper projecting from the slide plate adjacent the cam opening, and in which the cam member includes an operating finger extending generally radially from the cam member and generally along the exterior surface of the slide plate to engage the stopper when the slide plate is in the second engagement position.

8. The electrical connector of claim 1 in which the slide plate includes a stopper projecting from the slide plate adjacent the cam opening, and in which the cam member includes an operating finger extending generally radially from the cam member and generally along the exterior surface of the slide plate to engage the stopper when the slide plate is in the first insertion position.

* * * * *